United States Patent
Yu et al.

(10) Patent No.: US 10,621,299 B1
(45) Date of Patent: Apr. 14, 2020

(54) DYNAMIC PLATFORM SUPPORT IN PROGRAMMABLE INTEGRATED CIRCUITS

(71) Applicant: Xilinx, Inc., San Jose, CA (US)

(72) Inventors: Hao Yu, Broomfield, CO (US);
Raymond Kong, San Jose, CA (US);
Brian Martin, Longmont, CO (US);
Jun Liu, San Jose, CA (US); Kevin Beazley, Seattle, WA (US)

(73) Assignee: XILINX, INC., San Jose, CA (US)

(*) Notice: Subject to any disclaimer, the term of this patent is extended or adjusted under 35 U.S.C. 154(b) by 136 days.

(21) Appl. No.: 15/889,074

(22) Filed: Feb. 5, 2018

(51) Int. Cl.
*G06F 17/50* (2006.01)

(52) U.S. Cl.
CPC ...... *G06F 17/5054* (2013.01); *G06F 17/5072* (2013.01)

(58) Field of Classification Search
CPC .................. G06F 17/5054; G06F 17/5072
USPC ....................................................... 716/117
See application file for complete search history.

(56) References Cited

U.S. PATENT DOCUMENTS

| | | | | |
|---|---|---|---|---|
| 9,218,443 B1* | 12/2015 | Styles | ............ | G06F 8/451 |
| 2002/0073380 A1* | 6/2002 | Cooke | ............ | G06F 17/5045 |
| | | | | 716/102 |
| 2012/0284501 A1* | 11/2012 | Zievers | ............ | G06F 17/5027 |
| | | | | 713/100 |
| 2016/0132441 A1* | 5/2016 | Styles | ............ | G06F 13/28 |
| | | | | 710/110 |

* cited by examiner

*Primary Examiner* — Suchin Parihar
(74) *Attorney, Agent, or Firm* — Cuenot, Forsythe & Kim, LLC

(57) ABSTRACT

Providing dynamic platform support for a programmable integrated circuit (IC) can include loading a circuit design for a programmable IC, wherein the circuit design specifies a link region coupled to a first infrastructure region by first connections, and a kernel region coupled to the first infrastructure region by second connections and generating a base platform from the circuit design by removing the first infrastructure region, the kernel region, and the second connections from the circuit design and adding a wrapper that includes the first connections. A new platform can be generated from the base platform where the new platform includes the link region and, within the wrapper, a second infrastructure region coupled to the link region by the first connections.

20 Claims, 8 Drawing Sheets

DYNAMIC PLATFORM SUPPORT IN PROGRAMMABLE INTEGRATED CIRCUITS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to dynamic platform support in programmable ICs using partial reconfiguration.

BACKGROUND

A programmable integrated circuit (IC) refers to a type of IC that includes programmable circuitry. An example of a programmable IC is a field programable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), multipliers, digital signal processing blocks (DSPs), processors, clock managers, and delay lock loops (DLLs). Circuit designs may be physically implemented within the programmable circuitry of a programmable IC by loading a configuration bitstream into configuration memory of the programmable IC.

Partial reconfiguration is a process where a region of programmable circuitry within the programmable IC referred to as a "partial reconfiguration region" or "PR region" may be dynamically reconfigured by loading a partial configuration bitstream into the programmable IC. The partial configuration bitstream may specify different circuitry than previously implemented in the PR region. The partial configuration bitstream does not specify new and/or different circuitry for portions of programmable circuitry outside of the PR region. The PR region may undergo modification through partial reconfiguration, e.g., the loading of a partial configuration bitstream for the PR region, repeatedly where different partial configuration bitstreams specify different circuitry, while the other regions of the programmable circuitry of the programmable IC referred to as "static circuitry" or "static regions" continue to operate without interruption.

When using a circuit design with multiple PR regions, various characteristics of the PR regions remain constant. While the circuitry within each PR region may change over time using partial reconfiguration technology, the boundaries of each PR region may not be changed. As such, certain characteristics such as the size of each PR region, the shape of each PR region, the connectivity of each PR region to other PR regions and/or the static region, and the number of PR regions remains unchanged within the programmable IC.

SUMMARY

In one or more embodiments, a method can include loading, within computer hardware, a circuit design for a programmable integrated circuit (IC). The circuit design specifies a link region coupled to a first infrastructure region by first connections, and a kernel region coupled to the first infrastructure region by second connections. The method can include generating, using the computer hardware, a base platform from the circuit design by removing the first infrastructure region, the kernel region, and the second connections from the circuit design and adding a wrapper that includes the first connections. The method can also include generating, using the computer hardware, a new platform from the base platform, wherein the new platform includes the link region and, within the wrapper, a second infrastructure region coupled to the link region by the first connections.

In one or more embodiments, a method can include implementing, within a programmable IC, a link region having a communication circuit, a first infrastructure region, and a first kernel region. The link region is coupled to the first infrastructure region by first connections and the first infrastructure region is coupled to the first kernel region by second connections. The method can include loading a reset bitstream into the programmable IC, wherein the reset bitstream resets programmable circuitry of the programmable IC except for the link region and the first connections. The method can also include implementing, within the programmable IC, a second infrastructure region coupled to the link region by the first connections and a second kernel region coupled to the second infrastructure region by third connections. The second infrastructure region has different boundaries than the first infrastructure region.

In one or more embodiments, a system includes a memory configured to store program code and a processor coupled to the memory. The processor, in response to executing the program code, is configured to initiate operations. The operations can include loading a circuit design for a programmable IC. The circuit design specifies a link region coupled to a first infrastructure region by first connections, and a kernel region coupled to the first infrastructure region by second connections. The operations can include generating a base platform by removing the first infrastructure region, the kernel region, and the second connections from the circuit design and adding a wrapper that includes the first connections. The method can also include generating a new platform from the base platform. The new platform includes the link region and, within the wrapper, a second infrastructure region coupled to the link region by the first connections.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION OF THE DRAWINGS

Figure 1:
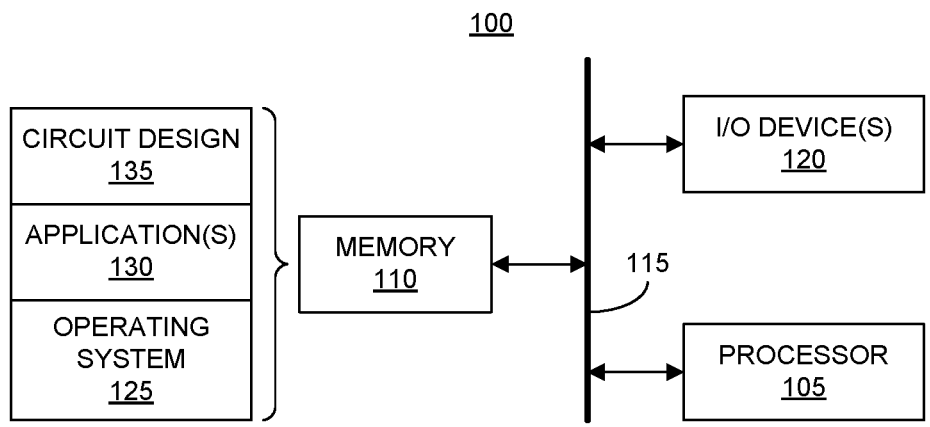
FIG. 1 illustrates example computer hardware for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to dynamic platform support in programmable ICs using partial reconfiguration. In accordance with the inventive arrangements described within this disclosure, systems, methods, and computer program products are provided that support implementation of partial reconfiguration regions (PR regions) with varying boundaries. In one or more embodiments, the boundaries of PR regions may be changed thereby facilitating circuit designs that may include different numbers of PR regions, PR regions of varying shape, PR regions of varying size, and/or PR regions of varying connectivity to other regions.

In particular embodiments, a static region of the programmable IC is used to implement circuitry for communicating with systems external to the programmable IC (e.g., off-chip). Other infrastructure circuitry is implemented in a PR region that supports hardware accelerated user applications and/or user specified circuitry (referred to herein as "kernels"). The kernels are implemented in yet another PR region. This allows the programmable IC to implement different infrastructure circuitry over time through partial reconfiguration to support the needs of different kernels implemented in the other PR region(s) of the programmable IC over time. As the different infrastructure circuitry and/or different kernels are implemented dynamically through partial reconfiguration, the static region is able to maintain a communication link with another system external to the programmable IC. Further, the different PR regions that implement kernel(s) and/or infrastructure circuitry are not constrained as to boundaries.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates example computer hardware 100 for use with one or more embodiments described herein. Computer hardware 100 may be used to implement a system such as a computer, a server, a portable computer such as a laptop or a tablet computer, or other data processing system having a processor configured to execute program code. A system or device implemented using computer hardware 100 is capable of performing the various operations described herein relating to partial reconfiguration whether generating such circuit designs and/or configuration bitstreams or controlling the partial reconfiguration process of one or more programmable ICs.

Computer hardware 100 includes at least one processor 105. Processor 105 is coupled to memory 110 through interface circuitry 115. Computer hardware 100 stores computer readable instructions (also referred to as "program code") within memory 110. Memory 110 is an example of computer readable storage media. Processor 105 executes the program code accessed from memory 110 via interface circuitry 115.

Memory 110 includes one or more physical memory devices such as, for example, a local memory and a bulk storage device. Local memory refers to non-persistent memory device(s) generally used during actual execution of program code. Examples of local memory include random access memory (RAM) and/or any of the various types of RAM that are suitable for use by a processor during execution of program code (e.g., dynamic RAM or "DRAM", synchronous DRAM or "SDRAM", and double data rate RAM or "DDR RAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. Computer hardware 100 may also include one or more cache memories (not shown) that provide temporary storage of at least some program code in order to reduce the number of times program code must be retrieved from a bulk storage device during execution.

Memory 110 is capable of storing program code. The program code may include routines, programs, objects, components, logic, data structures, and so on. For purposes of illustration, memory 110 stores an operating system 125, one or more application(s) 130, and a circuit design 135. In one or more embodiments, application(s) 130 include an EDA application. The EDA application is capable of performing a design flow (e.g., synthesis, placement, routing, and/or bitstream generation) and the various operations described herein on circuit design 135.

In an aspect, operating system 125 and application(s) 130, being implemented in the form of executable program code, are executed by computer hardware 100 and, more particularly, by processor 105, to perform the operations described within this disclosure. As such, operating system 125 and application(s) 130 may be considered an integrated part of computer hardware 100. Further, it should be appreciated that any data used, generated, and/or operated upon by computer hardware 100 (e.g., processor 105) are functional data structures that impart functionality when employed as part of the system.

Examples of interface circuitry 115 include, but are not limited to, an input/output (I/O) subsystem, an I/O interface, a bus system, and a memory interface. For example, interface circuitry 115 may be one or more of any of several types of bus structures, including a memory bus or memory controller, a peripheral bus, an accelerated graphics port, and a processor or local bus using any of a variety of bus architectures. By way of example, and not limitation, such bus architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer hardware 100 further may include one or more input/output (I/O) devices 120 coupled to interface circuitry 115. I/O devices 120 may be coupled to computer hardware 100, e.g., interface circuitry 115, either directly or through intervening I/O controllers. Examples of I/O devices 120 include, but are not limited to, a keyboard, a display device, a pointing device, one or more communication ports, a network adapter, etc. A network adapter refers to circuitry that enables computer hardware 100 to become coupled to other systems, computer systems, remote printers, and/or remote storage devices through intervening private or public networks. Modems, cable modems, Ethernet cards, and wireless transceivers are examples of different types of network adapters that may be used with computer hardware 100.

Computer hardware 100 may include fewer components than shown or additional components not illustrated in FIG. 1 depending upon the particular type of device and/or system that is implemented. In addition, the particular operating system, application(s), and/or I/O devices included may vary according to system type. Further, one or more of the illustrative components may be incorporated into, or otherwise form a portion of, another component. For example, a processor may include at least some memory. Computer hardware 100 may be used to implement a single computer or a plurality of networked or interconnected computers each implemented using the architecture of FIG. 1 or an architecture similar thereto.

In one or more embodiments, a system implemented using computer hardware 100 is capable of processing circuit design 135 to implement different platforms. As defined within this disclosure, the term "platform" means a static region of programmable circuitry coupled to a PR region of programmable circuitry. The static region implements communication circuitry capable of communicating with a system external to the programmable IC via a communication link. The PR region of programmable circuitry of the platform is coupled to the static region. The PR region of the platform implements infrastructure circuitry for use by kernels in reference to user applications (e.g., hardware accelerated user applications) and/or user specified portions of a circuit design.

Such a system, or another system similar thereto, is capable of controlling the partial reconfiguration process of a programmable IC to implement different platforms therein and/or different kernels therein over time. By implementing different platforms over time, different infrastructure circuitry may be provided that supports any of a variety of different functions that may be needed by different kernels implemented in the programmable IC. Additional flexibility is provided in that the PR regions used to implement the infrastructure circuitry and the kernel(s) may have different boundaries which facilitates PR regions of different sizes, different shapes, different connectivity, and different numbers of PR regions implemented concurrently in the programmable IC.

Figure 2:
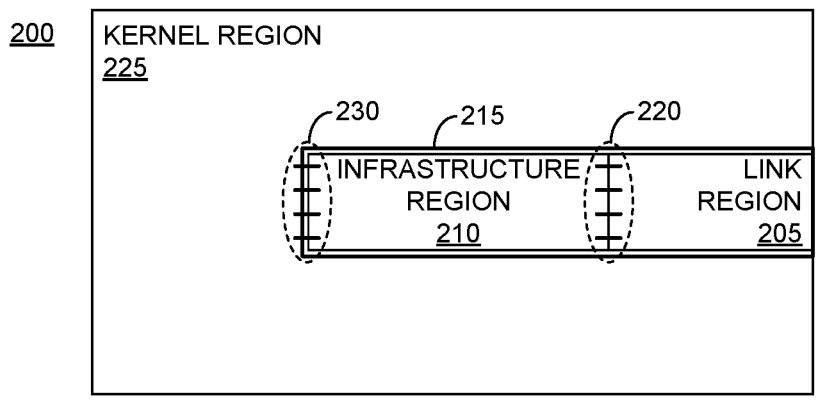
FIG. 2 illustrates an example of a platform for use with an integrated circuit IC).

FIG. 2 illustrates an example of a platform 215 for use with an IC 200. In one or more embodiments, IC 200 is implemented as a programmable IC. In the example of FIG. 2, IC 200 includes a platform 215 that includes a link region 205. Platform 215 further can include infrastructure region 210. Link region 205 and infrastructure region 210 are coupled by connections 220.

As defined within this disclosure, the term "link region" means a static region of programmable circuitry that includes or implements a communication circuit capable of communicating with a system located off-chip (e.g., external to the IC) via a communication link. The communication circuit is capable of establishing the communication link with the external system. In particular embodiments, the communication circuit is a communication endpoint. As defined within this disclosure, the term "static region" means a portion of programmable circuitry that remains operational and intact during partial reconfiguration while other portions of programmable circuitry (e.g., PR regions) are reconfigured to implement different circuits and/or perform different functions. A communication endpoint is a circuit that implements a network node and provides an interface for a communication channel or link. Examples of communication channels may include networks, buses, or point-to-point communication links. In one or more embodiments, the communication endpoint implemented by link region 205 is a Peripheral Component Interconnect Express (PCIe) endpoint.

As defined within this disclosure, an infrastructure region is a PR region that implements infrastructure circuitry utilized by a hardware accelerated user application such as a kernel. An infrastructure region is coupled to the link region of the platform. As defined within this disclosure, the term "PR region" refers to a portion of programmable circuitry that may be dynamically reconfigured by loading a partial configuration bitstream into the programmable IC to implement different circuitry and/or functions within the portion of programmable circuitry. A PR region may undergo modification through partial reconfiguration repeatedly while programmable circuitry in a static region of the programmable IC continues to operate without interruption.

In the example of FIG. 2, infrastructure region 210 is coupled to link region 205 via connections 220. Infrastructure region 210 provides infrastructure circuitry for use with kernels that may be implemented in the remaining portions of the programmable circuitry of IC 200 shown as kernel region 225. For example, infrastructure region 210 may include circuit blocks such as direct memory access (DMA) blocks and/or one or more different types of interfaces such as on-chip interconnects.

An example of an on-chip interconnect is an Advanced Microcontroller Bus Architecture (AMBA) eXtensible Interface (AXI) bus. An AMBA AXI bus is an embedded microcontroller bus interface for use in establishing on-chip connections between circuit blocks and/or systems. AXI is provided as an illustrative example of an interface and is not intended as a limitation of the embodiments described within this disclosure. As such, infrastructure region 210 may include one or more streaming interfaces (e.g., AXI streaming interfaces) and/or one or more memory mapped interfaces (e.g., AXI memory mapped interfaces). Other examples of interfaces can include, but are not limited to, other types of buses, a network-on-chip (NoC), a cross-bar, or other types of switches. Different ones of such interfaces may also be included in infrastructure region 210.

In one or more embodiments, link region 205 and/or infrastructure region 210 are provided by a third-party provider. As an illustrative and non-limiting example, link region 205 and/or infrastructure region 210 may be provided by an entity that provides IC 200 as part of a circuit board product or package. In another example, link region 205 and/or infrastructure region 210 may be provided by an entity that provides cloud computing services for end users where IC 200 is used to hardware accelerate user applications.

In general, platform 215 is capable of providing the infrastructure necessary to facilitate communication between the user specified kernels implemented within kernel region 225 and an external host through PCIe (or another communication channel) and memory (e.g., DDR memory). Due to varying applications and different feature sets provided by the kernels, different platforms are needed to satisfy different classes of applications while still achieving a high degree of optimization and efficiency. As noted, in the example of FIG. 2 user provided kernels may be implemented in kernel region 220. As defined within this disclosure, a kernel region is a PR region of programmable circuitry that is used to implement a kernel.

As such, the entity specifying link region 205 and infrastructure region 210 as part of platform 215 may be different from the entity specifying circuitry in kernel region 225. Kernel region 225 is coupled to infrastructure region 210 through one or more connections 230. The user circuitry implemented in kernel region 225 utilizes the infrastructure provided by infrastructure region 210 to operate and/or communicate with circuits and/or systems external to IC 200. The circuitry implemented in kernel region 225 is specifically matched to the infrastructure circuitry provided in infrastructure region 210.

The architecture illustrated in FIG. 2 supports situations where IC 200 maintains operability of the communication circuit (e.g., communication endpoint) implemented in link region 205. In particular, while kernel region 225 may be changed through partial reconfiguration, link region 205 continues to operate uninterrupted. Infrastructure region 210 may also be changed through partial reconfiguration while link region 205 continues to operate uninterrupted. For example, the communication endpoint within link region 205 may continue to operate and maintain an active communication link with another system or device while one or both of kernel region 225 and/or infrastructure region 210 are changed using partial reconfiguration.

By including the communication circuit within link region 205 and implementing other resources often used by kernels within infrastructure region 210, the variety of infrastructure circuitry provided to user applications may be changed within IC 200 without bringing down IC 200 and without IC 200 losing communication with external systems and/or devices.

Figure 3:
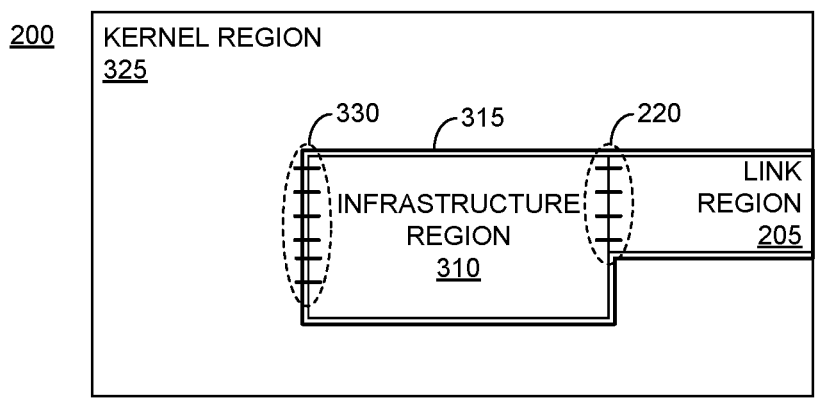
FIG. 3 illustrates another example of a platform for use with a programmable IC.

FIG. 3 illustrates another example of a platform 315 for use with IC 200. In the example of FIG. 3, IC 200 has undergone partial reconfiguration resulting in the implementation of different infrastructure and kernel regions shown as infrastructure region 310 and kernel region 325. In the example of FIG. 3, platform 315 includes the same static region as described in connection with FIG. 2, i.e., link region 205, connected to a different infrastructure region shown as infrastructure region 310.

Kernel region 325 implements a different user application, e.g., a different kernel, than was implemented in FIG. 2. Infrastructure region 310 couples to link region 205 via connections 215 (e.g., the same connections illustrated in FIG. 2). Because infrastructure region 310 provides different infrastructure circuitry than infrastructure region 210, infrastructure region 310 is capable of providing different connectivity to kernel region 325 shown as connections 330.

FIG. 3 illustrates a scenario where the type of infrastructure circuitry utilized by the user application implemented in kernel region 225 (e.g., a kernel) is different than the infrastructure circuitry utilized by the user application implemented in kernel region 325 (e.g., a different kernel). For example, the kernel implemented in kernel region 225 may utilize a streaming interface provided by infrastructure region 210, while the kernel implemented in kernel region 325 may utilize a memory mapped interface provided by infrastructure region 310.

By separating the communication circuit from the infrastructure circuitry, different platforms may be implemented in IC 200 to support different kernel requirements. The different types of infrastructure circuitry may be implemented within IC 200 without the communication circuit implemented therein losing connectivity with other systems. This is accomplished through partial reconfiguration where the size, shape, and/or connectivity of the PR regions may be changed. As seen by comparing FIG. 2 with FIG. 3, for example, the size, shape, and connectivity of both the infrastructure region and the kernel region change.

Figure 4:
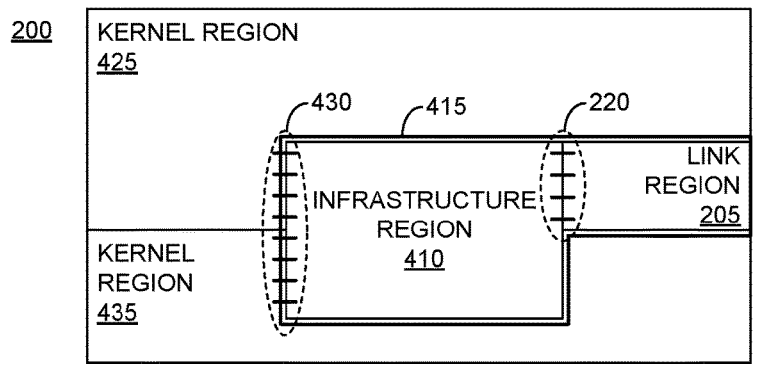
FIG. 4 illustrates another example of a platform for use with a programmable IC.

FIG. 4 illustrates another example of a platform 415 for use with IC 200. In the example of FIG. 4, IC 200 has again undergone partial reconfiguration resulting in the implementation of different infrastructure and kernel regions shown as infrastructure region 410 and kernel regions 425 and 435. In the example of FIG. 4, platform 415 includes the same static region as described in connection with FIGS. 2 and 3, i.e., link region 205, connected to a different infrastructure region shown as infrastructure region 410.

Kernel regions 425 and 435 may implement different kernels than implemented in FIGS. 2 and 3. Infrastructure region 410 couples to link region 205 via connections 215 (e.g., the same connections illustrated in FIGS. 2 and 3). Because infrastructure region 410 provides different infrastructure circuitry than infrastructure regions 210 and 310, infrastructure region 410 is capable of providing different connectivity to the kernel regions shown as connections 430, which are apportioned between kernel region 425 and kernel region 435.

FIG. 4 illustrates another scenario where the type of infrastructure circuitry utilized by the kernels implemented in kernel region 425 and kernel region 435 is different than the infrastructure circuitry utilized by the kernel implemented in kernel region 325 and/or 225. As seen by comparing FIGS. 2, 3, and 4, the size, shape, and connectivity of both the infrastructure region and the kernel region(s) has changed. Further, the number of PR regions has changed since two kernel regions are implemented in the example of FIG. 4.

The examples of FIGS. 2-4 illustrate cases where different kernels are to be implemented in IC 200 that have different infrastructure circuitry requirements. Rather than implement one infrastructure region that includes many different circuit resources to accommodate virtually any kernel which may go unused much of the time, FIGS. 2-4 illustrate how the platform may be adapted to the particular needs of the kernels. In cases where a different kernel is to be implemented that is suited to the same platform as already implemented in IC 200, only the kernel region need be partially reconfigured. The platform may be maintained intact. As such, the infrastructure region and/or the kernel region(s) may be changed independently of one another as may be required.

As noted, FIGS. 2-4 illustrate examples in which IC 200 is capable of maintaining a PCIe link (or other communication link) to an external system or host while different user applications are downloaded and implemented in IC 200. The platform, which may be provided by a data center vendor, a board vendor, or the like, facilitates targeted acceleration of the user applications.

Conventional techniques for providing different platforms have included both the infrastructure circuitry and the communication circuit within a static region. As such, changing the platform meant providing a different static region and thus a different static configuration bitstream for each different platform. With such a technique, the programmable IC is not able to communicate with external systems such as a host while the new static region is implemented to provide different infrastructure circuitry. Once the new static region is implemented, the host then must spend computing resources and time to re-establish the communication link to the newly reconfigured programmable IC.

Figure 5:
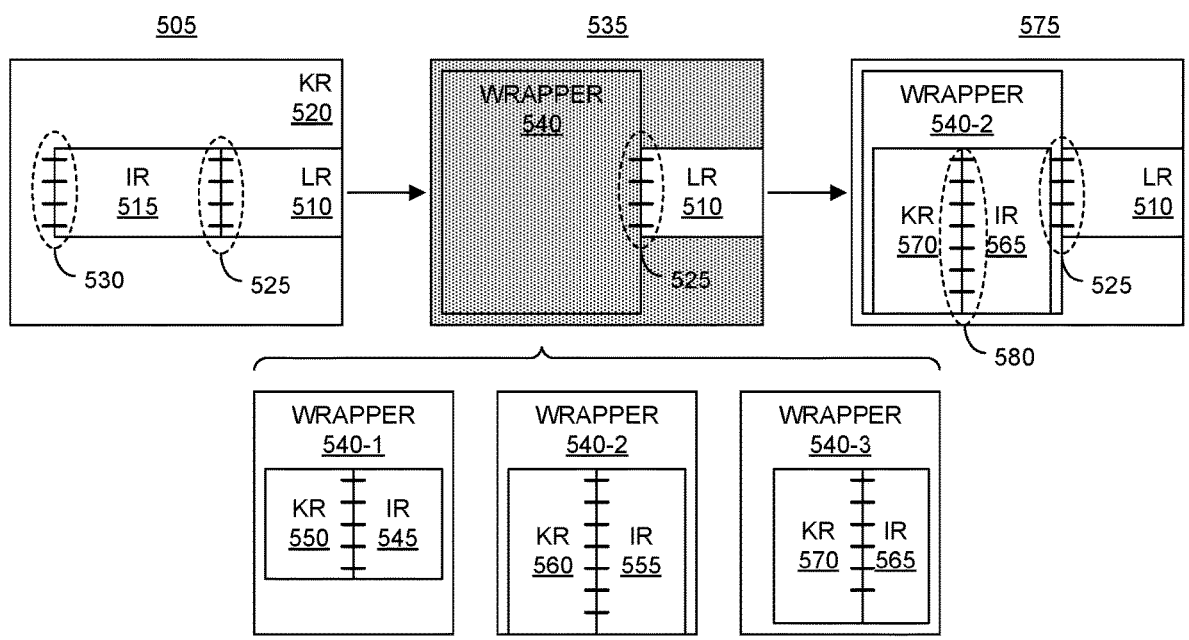
FIG. 5 illustrates an example of creating a base platform and a new platform.

FIG. 5 illustrates an example of implementing a base platform and a platform (e.g., a new platform). The operations described in connection with FIG. 5 may be performed by a system implemented using computer hardware as described in connection with FIG. 1. In the example of FIG. 5, a circuit design 505 is shown that includes a link region (abbreviated as "LR" in FIG. 5) 510, an infrastructure region (abbreviated as "IR" in FIGS. 5 and 6) 515, and a kernel region 520 (abbreviated as "KR" in FIG. 5). LR 510 is coupled to IR 515 via connections 525. IR 515 is coupled to kernel region 520 via connections 530.

The system is capable of generating a base platform 535. Base platform 535 refers to a circuit design that includes a link region and a wrapper 540. In the example of FIG. 5, the system removes IR 515, kernel region 520, and connections 530 from circuit design 505. The system preserves connections 525 and moves connections 525 into wrapper 540. In the example of FIG. 5, within base platform 535, wrapper 540 does not include or specify any circuitry other than connections 525.

A wrapper is a level of a logical hierarchy or a hierarchical module within a circuit design. The circuit design may be specified as a netlist, whether specified in register transfer level (RTL) format, a hardware description language (HDL), or in another suitable format. In one or more embodiments, a wrapper is implemented as a cell. The cell may be named "wrapper". A "cell" refers to a logical instance in a netlist. The instance may be a primitive instance such as a lookup table (LUT), a flip-flop, a block random access memory (BRAM), or a hierarchical instance such as a module that contains other modules or primitives. The content of the wrapper may be changed and may be defined by users. The wrapper may include one or more reconfigurable cells (e.g., sub-cells) and the connections and/or interconnections for such sub-cells.

In the example of FIG. 5, wrapper 540 within base platform 535 may be a hierarchical black-box that is initially empty. The system is capable of including connections 525 within wrapper 540 in creating base platform 535. In one or more embodiments, the system is capable of including connections between LR 510 and IR 515 (e.g., connections 525) and any connections (not shown) that may exist between LR 510 and KR 520 within wrapper 540 in creating base platform 535.

The system is capable of using base platform 535 to create new platforms for use with a programmable IC and user applications. For example, FIG. 5 illustrates different versions of wrapper 540 that may be implemented where each different version of wrapper 540 includes different infrastructure circuitry and different kernel circuitry. For example, the system is capable of generating a version of wrapper 540 shown as wrapper 540-1 that includes IR 545 and a kernel region 550. The system is capable of generating a version of wrapper 540 shown as wrapper 540-2 that includes IR 555 and kernel region 560. The system is capable of generating a version of wrapper 540 shown as wrapper 540-3 that includes IR 565 and kernel region 570. In each case, the base platform is modified by incorporating different infrastructure circuitry that references different kernel circuitry and coupling the infrastructure circuitry to LR 510 using connections 525 that may be maintained and included within wrapper 540. In the example of FIG. 5, KRs 550, 560, and 570 may be empty placeholders (e.g., empty modules).

The system is capable of generating a new platform 575 from base platform 535 where LR region 510 is integrated with one of the versions of wrapper 540, e.g., 540-2. Different platforms may be generated where each different platform uses a different version of wrapper 540. In particular embodiments, wrapper 540 may include an empty kernel region that is capable of receiving a user kernel. Further, wrapper 540, when part of a platform such as platform 575, may specify the connections between the infrastructure region and the kernel region(s). For example, in the case of platform 575, kernel region 570 may be empty and connections 580 may be specified as part of IR 565 and wrapper 540-2.

Figure 6:
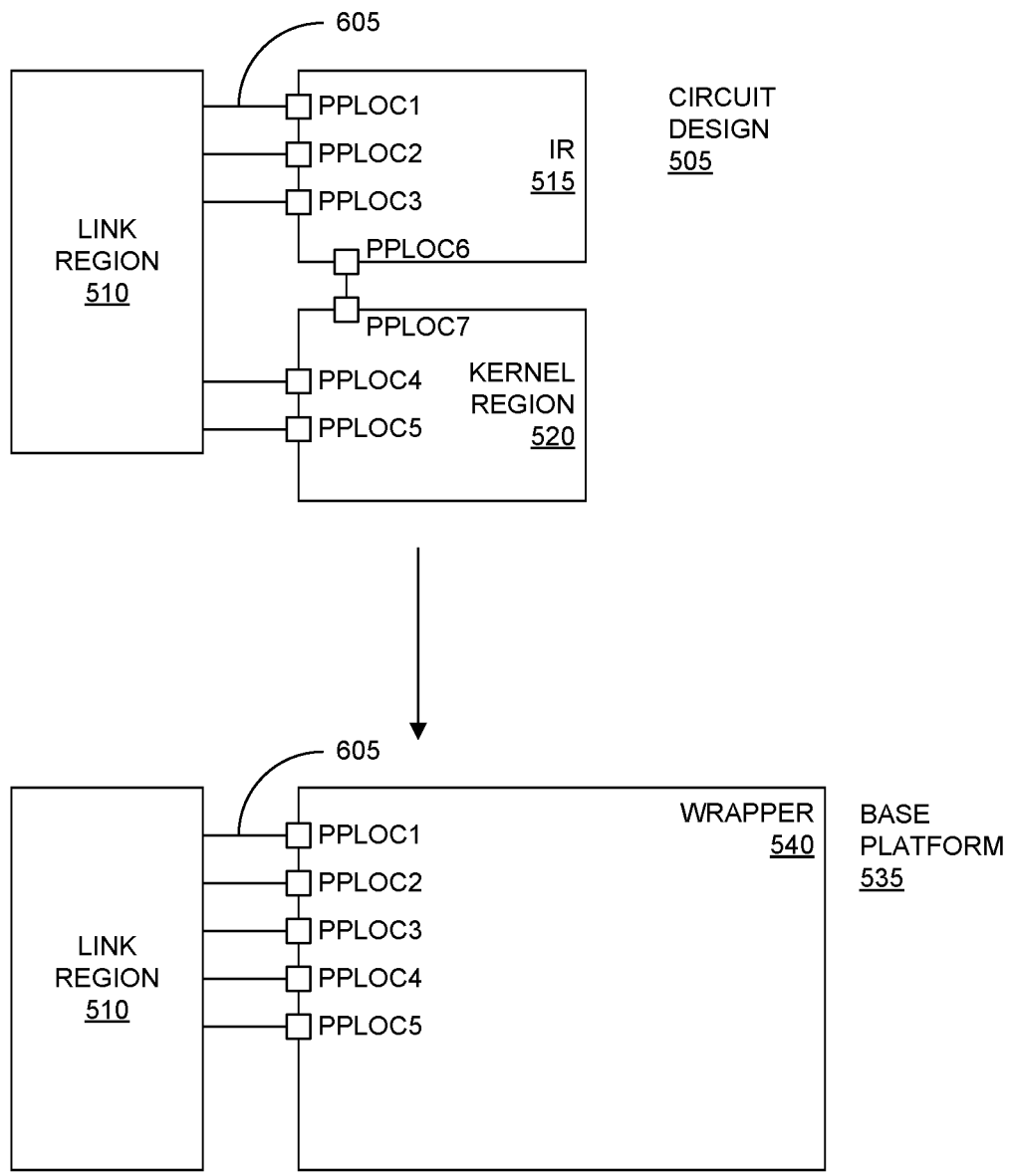
FIG. 6 illustrates another example of creating a base platform.

FIG. 6 illustrates another example of creating a base platform 535. The operations described in connection with FIG. 6 may be performed by a system implemented using computer hardware as described in connection with FIG. 1. In the example of FIG. 6, circuit design 505 is shown and connections 525 are illustrated in greater detail as PPLOCs 1-3. In the example of FIG. 6, link region 510 also couples directly to kernel region 520 via PPLOCs 4 and 5. A link region may support connections to both the infrastructure region and to one or more kernel regions or may be implemented to connect only to an infrastructure region.

A PPLOC refers to a partition pin with a parameter indicating that the partition pin is locked and may not be moved. Partition pins define signal crossings between a static region and a PR region or between PR regions. In the example of FIG. 6, link region 510 is coupled to IR 515 via PPLOCs 1-3 and to kernel region 520 via PPLOCs 4 and 5. IR 515 is coupled to kernel region 520 via PPLOCs 6 and 7 as pictured. PPLOCs 6 and 7 are not included in connections 525.

The system is capable of performing the operations described in connection with FIG. 5 to create base platform 535. Base platform 535 includes link region 510 and PPLOCs 1-5. As pictured, the system has moved PPLOCs 1-5 within wrapper 540 so that PPLOCs 1-5 are effectively ports of wrapper 540. Wrapper 540, however, does not include or specify any circuitry other than PPLOCs 1-5. For example, since PPLOCs 6 and 7 do not connect to link region 510, PPLOCs 6 and 7 are not included in wrapper 540. The system is also capable of moving physical routing 605 (the lines between link region 510 and the blocks corresponding to PPLOCs) for each PPLOCs 1-5 of infrastructure region 515 and/or kernel region 520 to wrapper 540 as illustrated in FIG. 6.

In an example where link region 510 is not coupled directly to kernel region 520, e.g., where PPLOC 4 and 5 are not included, wrapper 540 would preserve only the connections between the link region and the infrastructure region (e.g., PPLOCs 1-3).

Figure 7:
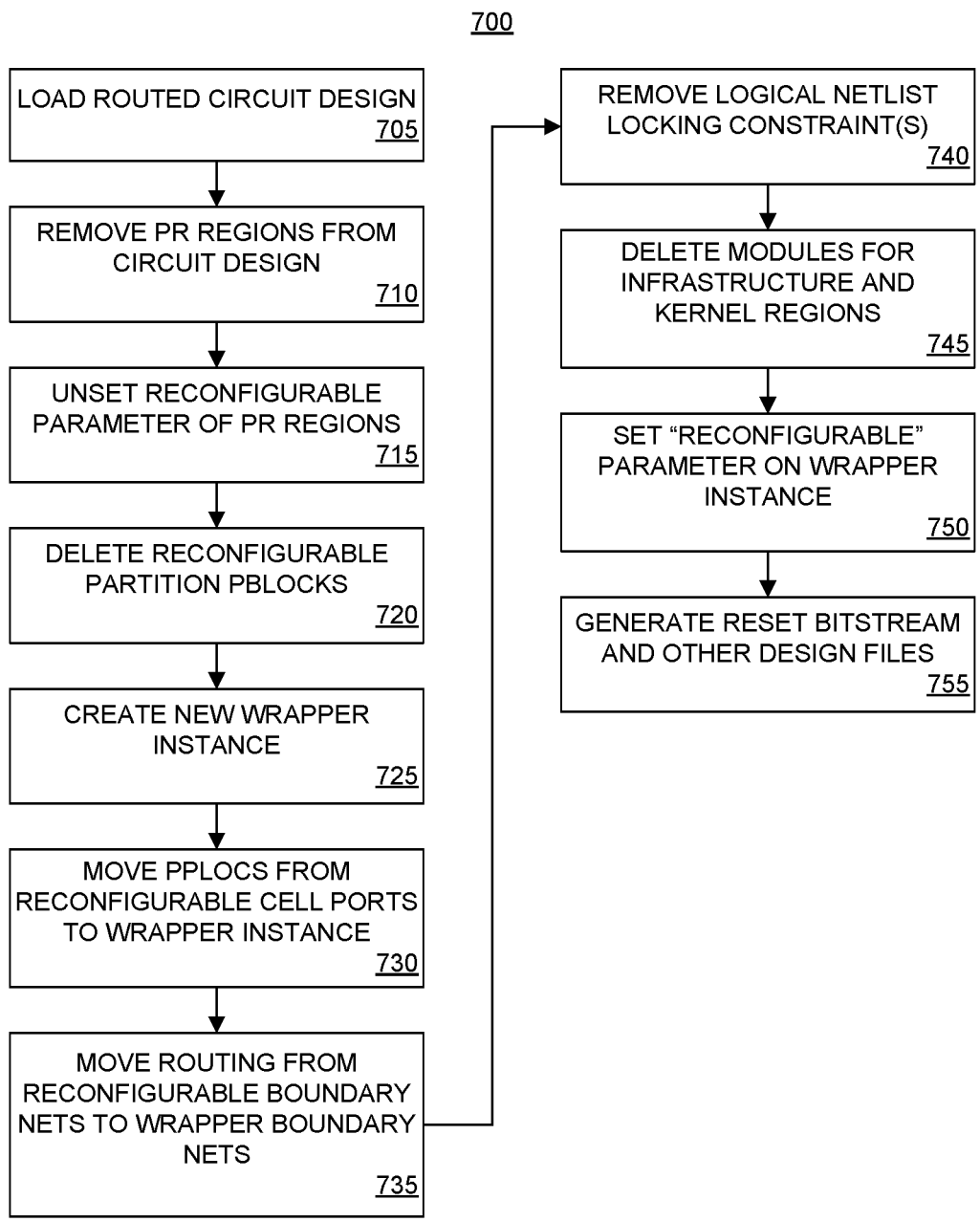
FIG. 7 illustrates an example method of creating a base platform.

FIG. 7 illustrates an example method 700 of creating a base platform. Method 700 may be performed by a system implemented using computer hardware as described herein in connection with FIG. 1.

Method 700 may begin in block 705 where the system is capable of loading a routed circuit design. The circuit design may include a link region, an infrastructure region, and one or more kernel regions. Further, the circuit design specifies connections between the link region and the infrastructure region and connections between the infrastructure region and the kernel region(s).

In one or more embodiments, the circuit design may be specified as a design checkpoint file. A design checkpoint file is a snapshot of a circuit design at a particular point within the design flow. A design checkpoint file may be saved in a database format and loaded or reloaded into a design space, e.g., an EDA application, as required. A design checkpoint file may include a logical netlist, netlist constraints, and physical data.

In block 710, the system removes the PR regions from the circuit design. For example, the system removes the contents of the infrastructure region and the contents of any kernel regions from the circuit design leaving the static region and connections from the static region to the now removed infrastructure region therein. For example, the contents specifying circuitry may be removed from the modules corresponding to the infrastructure region and the kernel region(s), respectively. In block 715, the system unsets the "reconfigurable" parameter on the now empty infrastructure and kernel regions (e.g., modules).

In block 720, the system is capable of deleting all of the reconfigurable partition PBLOCKS (RP PBLOCKS) in the circuit design. RP PBLOCKS are constructs within the circuit design that specify the overall reconfigurable footprint, e.g., the boundaries, of a PR region. The RP PBLOCK for a given PR region, for example, specifies the size and shape of that PR region. Once the RP PBLOCK of a PR region is deleted, that PR region has no physical footprint for the programmable IC. After performing block 720, for example, the circuit design includes the static circuitry of the link region and the connections from the static circuitry to logical "black boxes" (e.g., empty modules) corresponding to the infrastructure region and the kernel region. The circuit design includes no constraint information.

Because the circuit design includes the link region and the connections from the link region to the black box representing the infrastructure region, the circuit design includes the link region and the static placement and routing of nodes between the link region and the infrastructure region. The system effectively preserves these static placement and routing of the nodes between the link region and the black box representing the infrastructure region.

In block 725, the system creates a new wrapper instance. In block 730, the system moves the PPLOCs from the reconfigurable cell ports (e.g., the ports of the empty module corresponding to the infrastructure region) to the wrapper instance. The moved PPLOCs effectively become ports of the wrapper instance.

In block 735, the system is capable of moving the routing for the nets of the boundary of the infrastructure region that couple to the link region to the boundary nets of the wrapper instance. The system is capable of moving the physical routing of each connection between the link region and the infrastructure region into the wrapper instance. In particular embodiments, if any connections between the link region and the kernel region existed, such connections may be preserved by moving such physical routing into the wrapper.

In block 740, the system removes the "logical netlist locking" constraints for the infrastructure region and the kernel region. In block 745, the system deletes the modules for the infrastructure region and the kernel region. In block 750, the system sets the "reconfigurable" parameter on the wrapper instance. At this point, after block 750, the circuit design includes the link region and the wrapper instance, which includes the connections between the link region and the original infrastructure region. As noted, if such connections exist, the wrapper also includes any connections between the link region and the kernel region(s). Thus, after block 750, the resulting circuit design is an example of a base platform as described in connection with FIGS. 5 and 6.

In block 755, the system generates a reset bitstream and optionally other design files. The reset bitstream is a partial configuration bitstream that may be loaded into the programmable IC to reset programmable circuitry (e.g., all programmable circuitry) other than the link region and the connections from the link region to the original infrastructure region. The reset bitstream, for example, ensures that the routing resources that may have been used to connect the infrastructure region to the kernel region are cleared thereby avoiding any signal contention when further kernel regions and/or platforms are implemented.

As part of block 755, the system is also capable of generating and outputting a design checkpoint file that specifies the link region and the connections for the link region used to couple to an infrastructure region. In other embodiments, the system is also capable of generating and outputting one or more additional files such as HDL wrappers and/or templates, constraint files, and the like.

Figure 8:
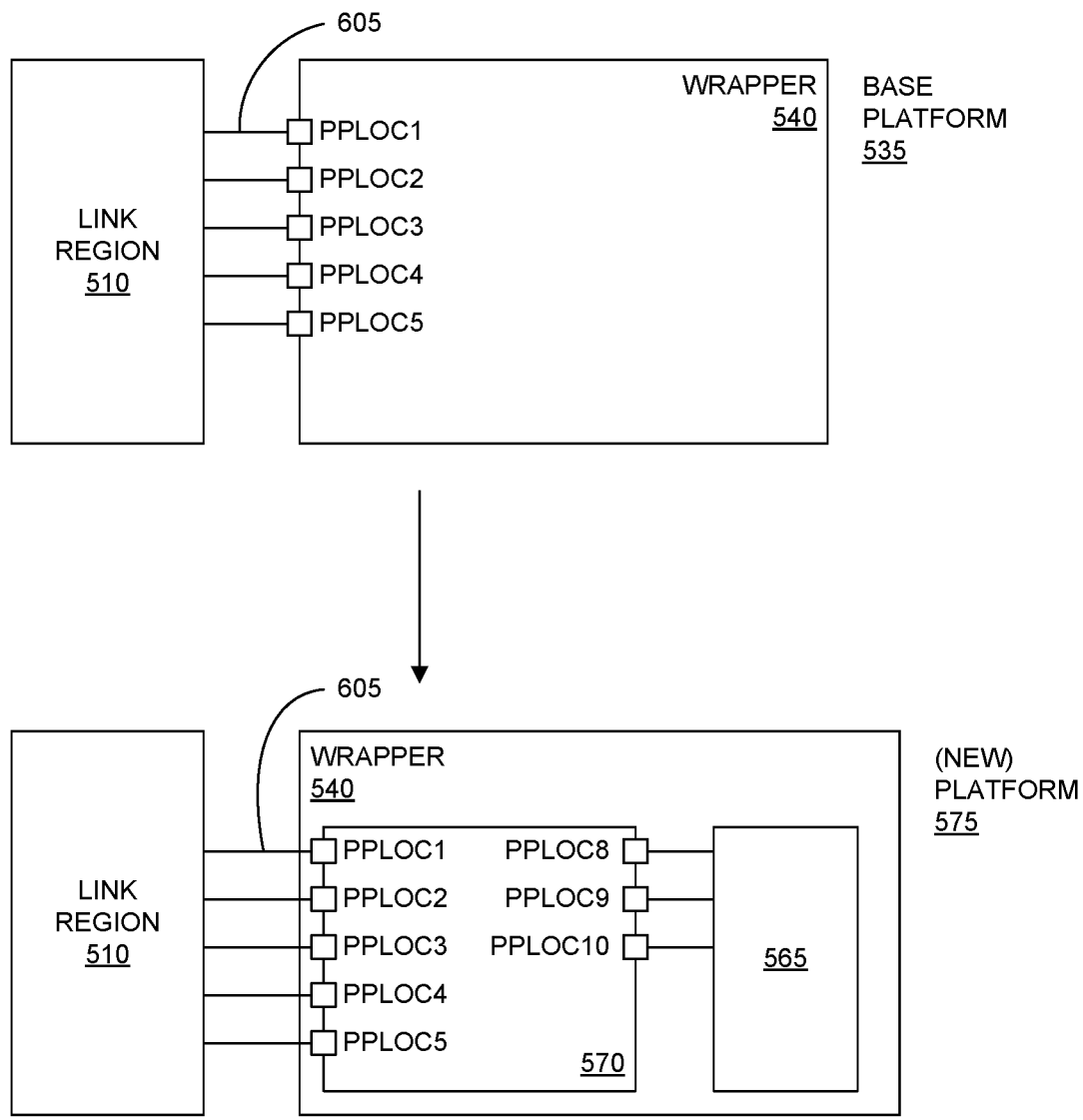
FIG. 8 illustrates an example of building a new platform.

FIG. 8 illustrates an example of building a new platform 575. The operations described in connection with FIG. 8 may be performed by a system implemented using computer hardware as described in connection with FIG. 1. In the example of FIG. 8, the system begins with base platform 535. As part of generating new platform 575, the system creates PR regions corresponding to infrastructure region 570 and kernel region 565 within wrapper 540. In the example of FIG. 8, the system has relocated PPLOCs 1-5 from wrapper 540 to the newly created PR region corresponding to infrastructure region 570. Similarly, the system has moved physical routing 605 to the PR region corresponding to infrastructure region 570.

The system further is capable of identifying any PPLOCs for the circuitry to be implemented within infrastructure region 570 that connects to the to the PR region corresponding to kernel region 565. Such PPLOCs and physical routing may be included in wrapper 540, e.g., added to the PR region corresponding to infrastructure region 565.

Figure 9:
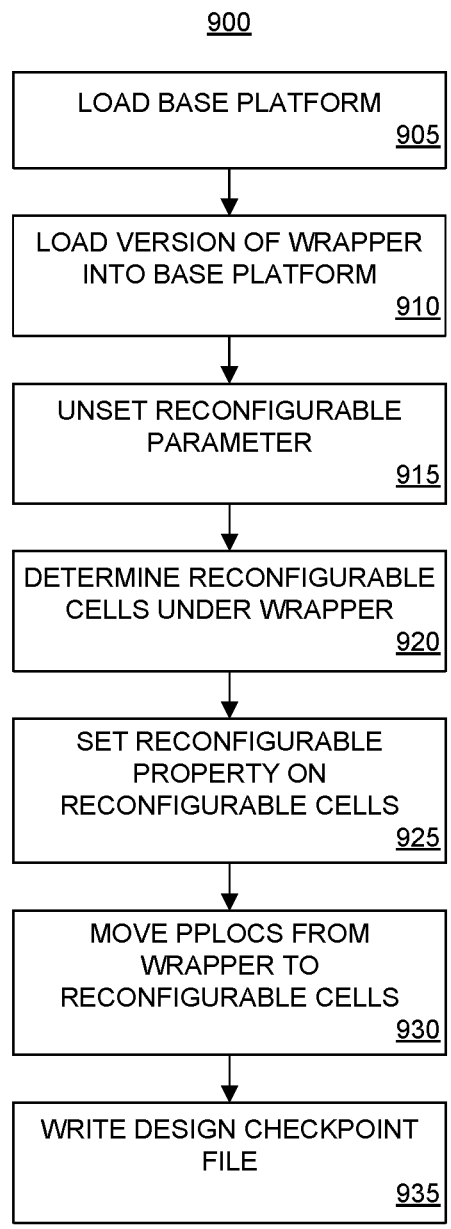
FIG. 9 illustrates an example method of building a new platform.

FIG. 9 illustrates an example method 900 of building a new platform. Method 900 may be performed by a system implemented using computer hardware as described in connection with FIG. 1. Method 900 begins in block 905 where the system loads the base platform into memory. Initially, the base platform (e.g., 535) includes a black box wrapper as illustrated in FIG. 5.

In block 910, the system loads a version of the wrapper into the base platform. Block 910 generally refers to the integration of a new module containing the logical design and connectivity for a new infrastructure region and a new kernel region. Examples of these modules are illustrated in FIG. 5 as different versions of the wrapper 540-1, 540-2, and 540-3. In one or more embodiments, the system is capable of replacing the black box wrapper of the base platform with one of the different versions of the wrapper available in the system. The system is capable of selecting a particular version of the wrapper that specifies the infrastructure region and/or kernel region desired.

In block 915, the system unsets the "reconfigurable" parameter on the wrapper in the base platform. In block 920, the system determines the reconfigurable cells under the wrapper. For example, the system is capable of determining the reconfigurable cells used to implement the particular infrastructure region specified by the wrapper and/or the particular kernel region(s) specified by the wrapper. In block 925, the system sets the "reconfigurable" property on the reconfigurable cells. In block 930, the system moves the PPLOCs from the wrapper to the reconfigurable cells. The system is further capable of moving any physical routing from the wrapper to the reconfigurable cells. In block 935, the system writes the design check point file. The design checkpoint file, e.g., the circuit design, may specify the link region, the infrastructure region, one or more kernel regions, and connectivity among the regions.

In one or more embodiments, the system is capable of processing the design checkpoint file generated in block 945 to create one or more partial configuration bitstreams. For example, the system is capable of performing operations such as synthesis, technology mapping, placement, routing, and bitstream generation as may be required. The system is capable of creating a partial configuration bitstream specifying the infrastructure region that couples to the link region via the preserved connections from the wrapper and that also specifies or includes the connections to be used to couple the infrastructure region to one or more kernel regions. The system is also capable of generating a partial configuration bitstream for each kernel region that connects to the infrastructure region.

Figure 10A:
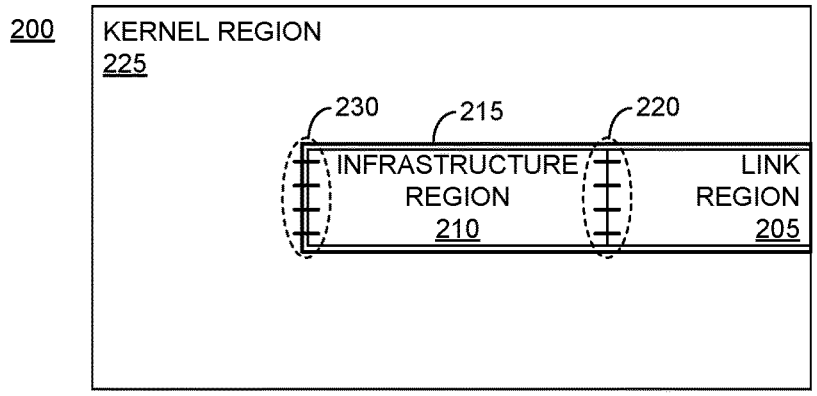
FIGS. 10A, 10B, 10C, and 10D illustrate an example of reconfiguring a programmable IC using a reset bitstream.

FIGS. 10A, 10B, 10C, and 10D (referred to collectively as FIG. 10) illustrate an example of reconfiguring a programmable IC using a reset bitstream. FIG. 10 illustrates how IC 200 is transitioned from using one type of platform to another, different platform while maintaining an active communication link with another system or device. Referring to FIG. 10A, IC 200 is operating and includes a platform 215 including link region 205 and infrastructure region 210. Platform 215 further includes connections 220 that couple link region 205 with infrastructure region 210. Platform 215 provides connectivity to kernel region 225 in the form of connections 230.

In the scenario where another kernel region is to be implemented in IC 200 that also utilizes platform 215, such other kernel region may be implemented in IC 200 using conventional partial reconfiguration. In that case, the new kernel region has the same shape and boundaries as kernel region 225. Further, the number of PR regions implemented in IC 200 remains constant (e.g., has not changed).

Figure 10B:
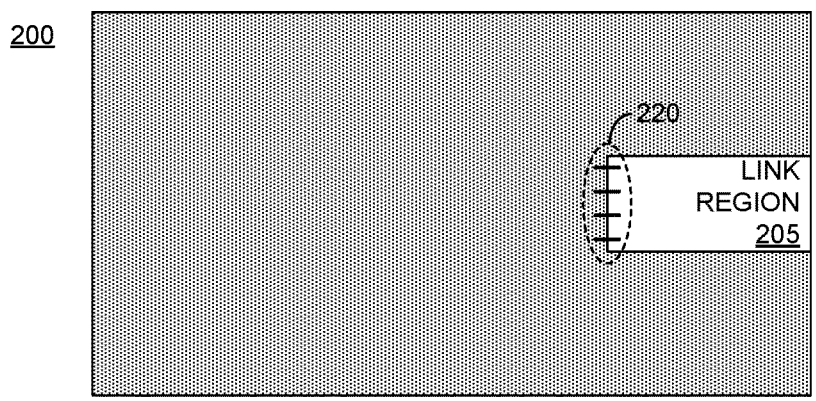

In the scenario where a different kernel region is to be implemented that requires different infrastructure circuitry, a different platform is needed. In that case, the number of PR regions, shape of PR regions, boundaries of PR regions, and/or connectivity among PR regions may change. Referring to FIG. 10B, the system, e.g., a host system or other external system is capable of loading a reset bitstream into IC 200. The reset bitstream is a partial configuration bitstream that places the programmable circuitry of IC 200, with the exception of link region 205 and connections 220, an initialized state. As such, the reset bitstream effectively removes or clears infrastructure region 210, kernel region 225, and connections 230. As noted, the system loads the reset bitstream into programmable IC 200 to clear routing within the programmable circuitry and avoid inadvertent signal contention.

Figure 10C:
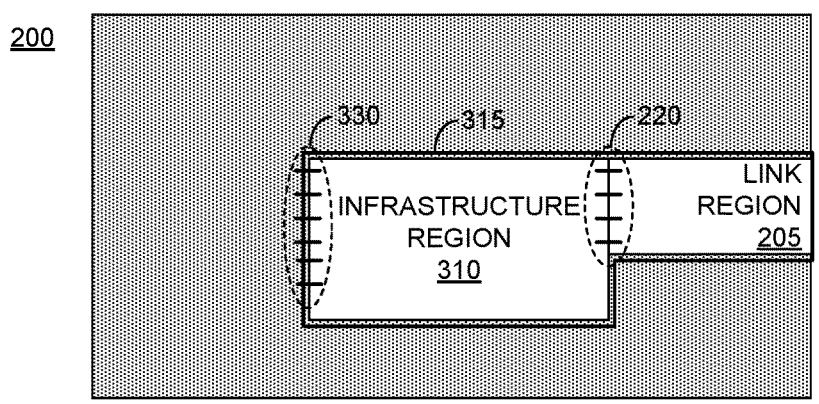

Subsequent to loading the reset bitstream into IC 200, the system is capable of loading one or more additional partial configuration bitstreams. For example, the system may load a first partial configuration bitstream that implements infrastructure region 310 and connections 330 as shown in FIG. 10C thereby completing platform 315. As pictured, in FIG. 10C, platform 315 has a different shape, different boundaries, and provides different conductivity to kernel region(s) from platform 215 shown in FIG. 10A.

In one or more embodiments, decoupling circuitry is created or inserted into the circuit design that disables communication interfaces between regions within IC 200 that are going to be reconfigured. As an illustrative and non-limiting example, a communication interface between a region (static or PR) and a PR region may include address signals, data signals, a ready signal, and a valid signal. The decoupling circuitry is capable of providing a control bit that forces each of the ready and valid signals to an "inactive" state. This prevents data from being sent or received across the interface. The decoupling circuitry isolates each side of the partition (e.g., each region) from detecting and acting on random signal transitions that may occur during partial reconfiguration.

In the example of FIG. 10, moving from FIG. 10B to FIG. 10C, the system (e.g., a host) is capable of loading a partial configuration bitstream to implement infrastructure region 310 and connections 330. In FIG. 10C, kernel region 325 is not yet programmed or implemented. In one or more embodiments, decoupling circuitry is included between link region 205 and infrastructure region 310 (e.g., implemented for connections 220). Further, decoupling circuitry is included between infrastructure circuitry 310 and kernel region 325 (e.g., implemented for connections 330). In particular embodiments, when implementing infrastructure region 310, the decoupling circuitry protecting connections 330 is enabled automatically or by default when the partial configuration bitstream for infrastructure region 310 is loaded to prevent data from passing via connections 330.

Figure 10D:
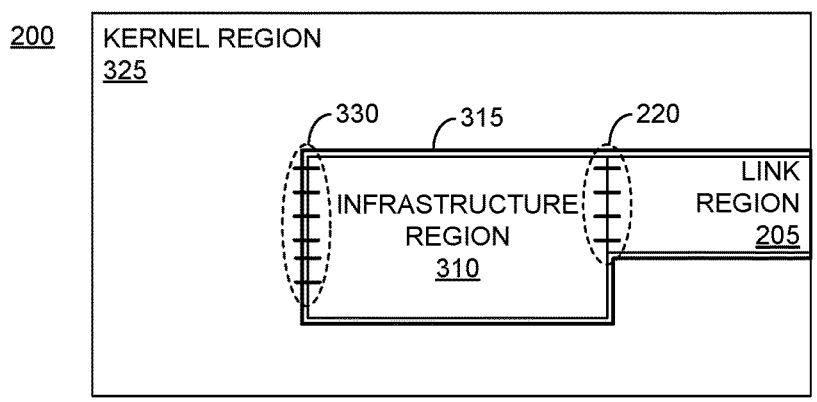

Subsequent to loading the partial configuration bitstream implementing infrastructure region 310 and connections 330 in FIG. 10C, the system is capable of loading a further partial configuration bitstream to implement kernel region 325 as shown in FIG. 10D. Once kernel region 325 is implemented, the decoupling circuitry between infrastructure region 310 and kernel region 325 may be disabled to allow data to pass via connections 330.

Figure 11:
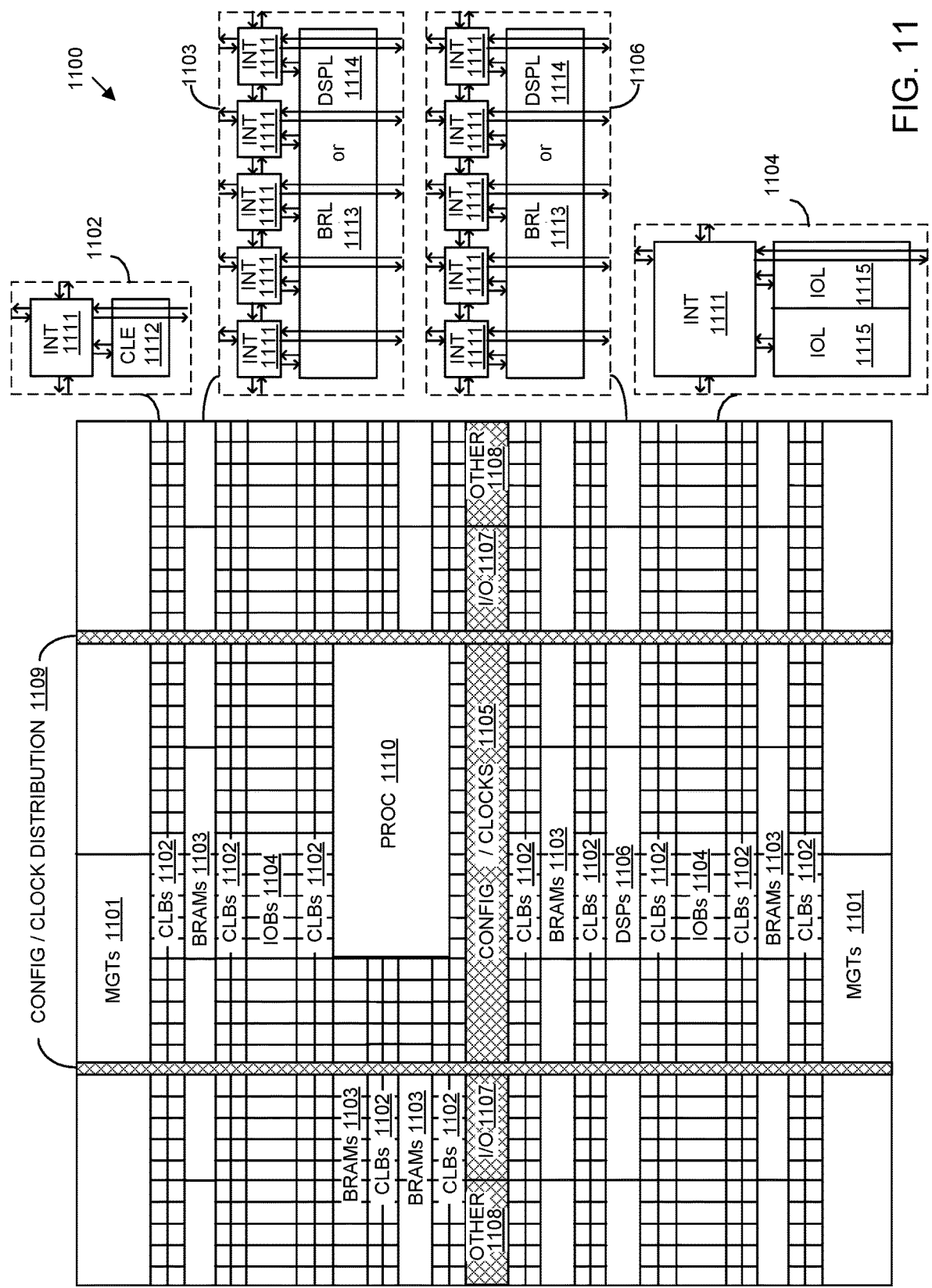
FIG. 11 illustrates an example architecture for an IC.

FIG. 11 illustrates an example architecture 1100 for an IC. In one aspect, architecture 1100 may be implemented within a programmable IC such as IC 200. For example, architecture 1100 may be used to implement a field programmable gate array (FPGA). Architecture 1100 may also be representative of a system-on-chip (SOC) type of IC. An SOC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1100 includes several different types of programmable circuit, e.g., logic, blocks. For example, architecture 1100 may include a large number of different programmable tiles including multi-gigabit transceivers (MGTs) 1101, configurable logic blocks (CLBs) 1102, random access memory blocks (BRAMs) 1103, input/output blocks (IOBs) 1104, configuration and clocking logic (CONFIG/CLOCKS) 1105, digital signal processing blocks (DSPs) 1106, specialized I/O blocks 1107 (e.g., configuration ports and clock ports), and other programmable logic 1108 such as digital clock managers, analog-to-digital converters, system monitoring logic, and so forth.

In some ICs, each programmable tile includes a programmable interconnect element (INT) 1111 having standardized connections to and from a corresponding INT 1111 in each adjacent tile. Therefore, INTs 1111, taken together, implement the programmable interconnect structure for the illustrated IC. Each INT 1111 also includes the connections to and from the programmable logic element within the same tile, as shown by the examples included at the top of FIG. 11.

For example, a CLB 1102 may include a configurable logic element (CLE) 1112 that may be programmed to implement user logic plus a single INT 1111. A BRAM 1103 may include a BRAM logic element (BRL) 1113 in addition to one or more INTs 1111. Typically, the number of INTs 1111 included in a tile depends on the height of the tile. As pictured, a BRAM tile has the same height as five CLBs, but other numbers (e.g., four) also may be used. A DSP tile 1106 may include a DSP logic element (DSPL) 1114 in addition to an appropriate number of INTs 1111. An 1OB 1104 may include, for example, two instances of an I/O logic element (IOL) 1115 in addition to one instance of an INT 1111. The actual I/O pads connected to IOL 1115 may not be confined to the area of IOL 1115.

In the example pictured in FIG. 11, a columnar area near the center of the die, e.g., formed of regions 1105, 1107, and 1108, may be used for configuration, clock, and other control logic. Horizontal areas 1109 extending from this column may be used to distribute the clocks and configuration signals across the breadth of the programmable IC.

Some ICs utilizing the architecture illustrated in FIG. 11 include additional logic blocks that disrupt the regular columnar structure making up a large part of the IC. The additional logic blocks may be programmable blocks and/or dedicated circuitry. For example, a processor block depicted as PROC 1110 spans several columns of CLBs and BRAMs.

In one aspect, PROC 1110 may be implemented as dedicated circuitry, e.g., as a hardwired processor, that is fabricated as part of the die that implements the programmable circuitry of the IC. PROC 1110 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1110 may be omitted from architecture 1100 and replaced with one or more of the other varieties of the programmable blocks described. Further, such blocks may be utilized to form a "soft processor" in that the various blocks of programmable circuitry may be used to form a processor that can execute program code as is the case with PROC 1110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 11 that are external to PROC 1110 such as CLBs 1102 and BRAMs 1103 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1110.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 1110 or a soft processor. In some cases, architecture 1100 includes a dedicated configuration processor that loads the configuration bitstream to the appropriate configuration memory and/or processor memory. The dedicated configuration processor does not execute user-specified program code. In other cases, architecture 1100 may utilize PROC 1110 to receive the configuration bitstream, load the configuration bitstream into appropriate configuration memory, and/or extract program code for execution.

FIG. 11 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 11 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1110 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method can include loading, within computer hardware, a circuit design for a programmable IC. The circuit design specifies a link region coupled to a first infrastructure region by first connections, and a kernel region coupled to the first infrastructure region by second connections. The method can include generating, using the computer hardware, a base platform from the circuit design by removing the first infrastructure region, the kernel region, and the second connections from the circuit design and adding a wrapper that includes the first connections. The method can also include generating, using the computer hardware, a new platform from the base platform, wherein the new platform includes the link region and, within the wrapper, a second infrastructure region coupled to the link region by the first connections.

In an aspect, the link region implements a communication circuit that is configured to maintain a communication link with an external system during partial reconfiguration of the programmable IC.

In another aspect, the wrapper of the base platform further includes a blank kernel region that couples to the second infrastructure region and connections between the second infrastructure region and the blank kernel region.

In another aspect, the method can also include generating a reset bitstream from the base platform, wherein the reset bitstream is configured to reset programmable circuitry of the programmable IC except for the link region and the first connections.

In another aspect, the second infrastructure region differs from the first infrastructure region in size.

In another aspect, the second infrastructure region differs from the first infrastructure region in shape.

In another aspect, the second infrastructure region includes different circuit resources than the first infrastructure region.

In another aspect, the second infrastructure region provides different connectivity to kernels than the first infrastructure region.

In one or more embodiments, a method can include implementing, within a programmable IC, a link region having a communication circuit, a first infrastructure region, and a first kernel region. The link region is coupled to the first infrastructure region by first connections and the first infrastructure region is coupled to the first kernel region by second connections. The method can include loading a reset bitstream into the programmable IC, wherein the reset bitstream resets programmable circuitry of the programmable IC except for the link region and the first connections. The method can also include implementing, within the programmable IC, a second infrastructure region coupled to the link region by the first connections and a second kernel region coupled to the second infrastructure region by third connections. The second infrastructure region has different boundaries than the first infrastructure region.

In an aspect, the first infrastructure region differs from the second infrastructure region in size.

In another aspect, the first infrastructure region differs from the second infrastructure region in shape.

In another aspect, the communication circuit of the link region remains in communication with an external system throughout the loading of the reset bitstream and the implementing of the second infrastructure region and the second kernel region.

In one or more embodiments, a system includes a memory configured to store program code and a processor coupled to the memory. The processor, in response to executing the program code, is configured to initiate operations. The operations can include loading a circuit design for a programmable IC. The circuit design specifies a link region coupled to a first infrastructure region by first connections, and a kernel region coupled to the first infrastructure region by second connections. The operations can include generating a base platform by removing the first infrastructure region, the kernel region, and the second connections from the circuit design and adding a wrapper that includes the first connections. The method can also include generating a new platform from the base platform. The new platform includes the link region and, within the wrapper, a second infrastructure region coupled to the link region by the first connections.

In an aspect, the link region implements a communication circuit that is configured to maintain a communication link with an external system during partial reconfiguration of the programmable IC.

In another aspect, the wrapper of the base platform further includes a blank kernel region that couples to the second infrastructure region and connections between the second infrastructure region and the blank kernel region.

In another aspect, the operations can also include generating a reset bitstream from the base platform, wherein the reset bitstream is configured to reset programmable circuitry of the programmable IC except for the link region and the first connections.

In another aspect, the second infrastructure region differs from the first infrastructure region in size.

In another aspect, the second infrastructure region differs from the first infrastructure region in shape.

In another aspect, the second infrastructure region includes different circuit resources than the first infrastructure region.

In another aspect, the second infrastructure region provides different connectivity to kernels than the first infrastructure region.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
    loading, within computer hardware, a circuit design for a programmable integrated circuit, wherein the circuit design specifies a link region coupled to a first infrastructure region by first connections, and a kernel region coupled to the first infrastructure region by second connections;
    generating, using the computer hardware, a base platform from the circuit design by removing the first infrastructure region, the kernel region, and the second connections from the circuit design and adding a wrapper that includes the first connections; and
    generating, using the computer hardware, a new platform from the base platform, wherein the new platform includes the link region and, within the wrapper, a second infrastructure region coupled to the link region by the first connections.

2. The method of claim 1, wherein the link region implements a communication circuit that is configured to maintain a communication link with an external system during partial reconfiguration of the programmable integrated circuit.

3. The method of claim 1, wherein the wrapper of the base platform further includes a blank kernel region that couples to the second infrastructure region and connections between the second infrastructure region and the blank kernel region.

4. The method of claim 1, further comprising:
    generating a reset bitstream from the base platform, wherein the reset bitstream is configured to reset programmable circuitry of the programmable integrated circuit except for the link region and the first connections.

5. The method of claim 1, wherein the second infrastructure region differs from the first infrastructure region in size.

6. The method of claim 1, wherein the second infrastructure region differs from the first infrastructure region in shape.

7. The method of claim 1, wherein the second infrastructure region includes different circuit resources than the first infrastructure region.

8. The method of claim 1, wherein the second infrastructure region provides different connectivity to kernels than the first infrastructure region.

9. A method, comprising:
    implementing, within a programmable integrated circuit, a link region having a communication circuit, a first infrastructure region, and a first kernel region, wherein the link region is coupled to the first infrastructure region by first connections and the first infrastructure region is coupled to the first kernel region by second connections;
    loading a reset bitstream into the programmable integrated circuit, wherein the reset bitstream resets programmable circuitry of the programmable integrated circuit except for the link region and the first connections; and
    implementing, within the programmable integrated circuit, a second infrastructure region coupled to the link region by the first connections and a second kernel region coupled to the second infrastructure region by third connections;
    wherein the second infrastructure region has different boundaries than the first infrastructure region.

10. The method of claim 9, wherein the first infrastructure region differs from the second infrastructure region in size.

11. The method of claim 9, wherein the first infrastructure region differs from the second infrastructure region in shape.

12. The method of claim 9, wherein the communication circuit of the link region remains in communication with an external system throughout the loading of the reset bitstream and the implementing of the second infrastructure region and the second kernel region.

13. A system, comprising:
a memory configured to store program code; and
a processor coupled to the memory, wherein the processor, in response to executing the program code, is configured to initiate operations including:
loading a circuit design for a programmable integrated circuit, wherein the circuit design specifies a link region coupled to a first infrastructure region by first connections, and a kernel region coupled to the first infrastructure region by second connections;
generating a base platform by removing the first infrastructure region, the kernel region, and the second connections from the circuit design and adding a wrapper that includes the first connections; and
generating a new platform from the base platform, wherein the new platform includes the link region and, within the wrapper, a second infrastructure region coupled to the link region by the first connections.

14. The system of claim 13, wherein the link region implements a communication circuit that is configured to maintain a communication link with an external system during partial reconfiguration of the programmable integrated circuit.

15. The system of claim 13, wherein the wrapper of the base platform further includes a blank kernel region that couples to the second infrastructure region and connections between the second infrastructure region and the blank kernel region.

16. The system of claim 13, wherein the processor is configured to initiate operations further comprising:
generating a reset bitstream from the base platform, wherein the reset bitstream is configured to reset programmable circuitry of the programmable integrated circuit except for the link region and the first connections.

17. The system of claim 13, wherein the second infrastructure region differs from the first infrastructure region in size.

18. The system of claim 13, wherein the second infrastructure region differs from the first infrastructure region in shape.

19. The system of claim 13, wherein the second infrastructure region includes different circuit resources than the first infrastructure region.

20. The system of claim 13, wherein the second infrastructure region provides different connectivity to kernels than the first infrastructure region.

* * * * *